US008631288B2

(12) United States Patent
Helm et al.

(10) Patent No.: US 8,631,288 B2
(45) Date of Patent: Jan. 14, 2014

(54) METHODS, DEVICES, AND SYSTEMS FOR DATA SENSING IN A MEMORY SYSTEM

(75) Inventors: Mark A. Helm, Santa Cruz, CA (US); Uday Chandrasekhar, San Jose, CA (US)

(73) Assignee: Micron Technology, Inc., Boise, ID (US)

( * ) Notice: Subject to any disclaimer, the term of this patent is extended or adjusted under 35 U.S.C. 154(b) by 367 days.

(21) Appl. No.: 13/047,555

(22) Filed: Mar. 14, 2011

(65) Prior Publication Data

US 2012/0240011 A1    Sep. 20, 2012

(51) Int. Cl.
*G11C 29/00*    (2006.01)

(52) U.S. Cl.
USPC .................... 714/721; 714/723; 714/773

(58) Field of Classification Search
None
See application file for complete search history.

(56) References Cited

U.S. PATENT DOCUMENTS

| | | | | |
|---|---|---|---|---|
| 5,200,923 | A * | 4/1993 | Sekiguchi | 365/185.2 |
| 7,069,377 | B2 * | 6/2006 | Roohparvar | 711/103 |
| 7,558,109 | B2 | 7/2009 | Brandman et al. | |
| 7,882,408 | B1 * | 2/2011 | Choe et al. | 714/719 |
| 8,032,810 | B2 * | 10/2011 | Ishikawa et al. | 714/754 |
| 8,327,224 | B2 * | 12/2012 | Larsen et al. | 714/763 |
| 8,423,842 | B2 * | 4/2013 | Nakano et al. | 714/721 |
| 2007/0091677 | A1 | 4/2007 | Lasser et al. | |
| 2008/0263265 | A1 | 10/2008 | Litsyn | |
| 2008/0310234 | A1 | 12/2008 | Lee et al. | |
| 2009/0003058 | A1 | 1/2009 | Kang | |
| 2009/0282186 | A1 | 11/2009 | Mokhlesi et al. | |
| 2010/0020611 | A1 * | 1/2010 | Park | 365/185.09 |
| 2010/0165730 | A1 | 7/2010 | Sommer et al. | |
| 2010/0208524 | A1 | 8/2010 | Sarin et al. | |
| 2011/0047422 | A1 * | 2/2011 | Aritome | 714/718 |

OTHER PUBLICATIONS

International Search Report and Opinion for related PCT Application No. PCT/US2012/028745, Mailed May 31, 2012, (9 pages).

* cited by examiner

*Primary Examiner* — Daniel McMahon
(74) *Attorney, Agent, or Firm* — Brooks, Cameron & Huebsch, PLLC (57) ABSTRACT

Methods, devices, and systems for data sensing in a memory system can include performing a number of successive sense operations on a number of memory cells using a number of different sensing voltages, determining a quantity of the number memory cells that change states between consecutive sense operations of the number of successive sense operations, and determining, based at least partially on the determined quantity of the number of memory cells that change states between consecutive sense operations, whether to output hard data corresponding to one of the number of successive sense operations.

36 Claims, 3 Drawing Sheets

METHODS, DEVICES, AND SYSTEMS FOR DATA SENSING IN A MEMORY SYSTEM

TECHNICAL FIELD

The present disclosure relates generally to semiconductor memory devices, methods, and systems, and more particularly, to methods, devices, and systems for data sensing.

BACKGROUND

Memory devices are typically provided as internal, semiconductor, integrated circuits and/or external removable devices in computers or other electronic devices. There are many different types of memory including random-access memory (RAM), read only memory (ROM), dynamic random access memory (DRAM), synchronous dynamic random access memory (SDRAM), phase change random access memory (PCRAM), and flash memory, among others.

Flash memory devices can be utilized as volatile and non-volatile memory for a wide range of electronic applications. Flash memory devices typically use a one-transistor memory cell that allows for high memory densities, high reliability, and low power consumption. Uses for flash memory include memory for solid state drives (SSDs), personal computers, personal digital assistants (PDAs), digital cameras, cellular telephones, portable music players, e.g., MP3 players, and movie players, among other electronic devices. Data, such as program code, user data, and/or system data, such as a basic input/output system (BIOS), are typically stored in flash memory devices.

Two common types of flash memory array architectures are the "NAND" and "NOR" architectures, so called for the logical form in which the basic memory cell configuration of each is arranged. A NAND array architecture arranges its array of memory cells in a matrix such that the control gates of each memory cell in a "row" of the array are coupled to (and in some cases form) an access line, which is commonly referred to in the art as a "word line". However each memory cell is not directly coupled to a data line (which is commonly referred to as a digit line, e.g., a bit line, in the art) by its drain. Instead, the memory cells of the array are coupled together in series, source to drain, between a common source and a data line, where the memory cells commonly coupled to a particular data line are referred to as a "column".

Memory cells in a NAND array architecture can be programmed to a target, e.g., desired, state. For example, electric charge can be placed on or removed from a charge storage structure of a memory cell to put the cell into one of a number of programmed states. For example, a single level cell (SLC) can represent two states, e.g., 1 or 0. Flash memory cells can also store more than two states, e.g., 1111, 0111, 0011, 1011, 1001, 0001, 0101, 1101, 1100, 0100, 0000, 1000, 1010, 0010, 0110, and 1110. Such cells can be referred to as multilevel cells (MLCs). MLCs can allow the manufacture of higher density memories without increasing the number of memory cells since each cell can represent more than one digit, e.g., more than one bit. For example, a cell capable of representing four digits can have sixteen programmed states.

Sensing operations, e.g., read and/or program verify operations, can use sensing voltages to determine the state of flash memory cells. However, a number of mechanisms, such as read disturb, program disturb, and/or charge loss, e.g., charge leakage, can cause the stored charge on the charge storage structure, e.g., the threshold voltage (Vt), of the memory cells, to change. As a result of the change in the stored charge, previously used sensing voltages, e.g., sensing voltages used prior to the change in the stored charge occurs, may no longer provide accurate and/or reliable sensing of the memory cells. That is, previously used sensing voltages may result in an erroneous sensing of the memory cells when used during subsequent sensing operations. For example, the use of previous sensing voltages may result in a determination that the memory cells are in a state other than the target state, e.g., a state different than the target state to which the cell was programmed.

DETAILED DESCRIPTION

The present disclosure includes methods, devices, and systems for data sensing. One such method includes performing a number of sense operations on a number of memory cells using a number of different sensing signals, determining a quantity of the memory cells that change sensed states between the sense operations, and determining, based at least partially on the determined quantity of the number of memory cells that change sensed states between the sense operations, whether to output first data associated with the number of cells or to output second data associated with the number of cells.

One or more embodiments can include determining a quantity that change states between one of the number of sense operations and another of the number of sense operations that change states, and outputting the first data in response to a determination that the determined quantity is less than a threshold, wherein the first data corresponds to either data sensed during the one of the sense operations or data sensed during the other of the sense operations. One or more embodiments can also include outputting the second data if the determined quantity of the memory cells is greater than the threshold.

In one or more embodiments, first data can include only hard data or the hard data and a first amount of soft data and second data can include hard data, soft data, or the hard data and a second amount of soft data.

Soft data associated with a memory cell can indicate, for example, a location of a threshold voltage (Vt) of the memory cell within a Vt distribution representing the target state to which the memory cell was programmed, as will be further described herein. Additionally, soft data can indicate a probability of whether the Vt of a memory cell corresponds to the target state to which the memory cell was programmed, as will be further described herein. In contrast, data that corresponds to the actual data state of a memory cell be referred to as hard data, as will be further described herein.

In one or more embodiments of the present disclosure, soft data can be provided from a memory device to a controller external to the memory device only when advanced ECC is needed to correct data read from a number of memory cells. For instance, if successive reads, in accordance with embodiments described herein, result in a determined quantity of bits correctable via regular ECC, e.g., without soft data, the hard data associated with the number of memory cells is provided to the external controller and the soft data associated with the number of memory cells is not provided to the external controller. In some previous approaches, hard data and soft data are provided to the controller after every read. Other approaches provide only hard data, such that advanced ECC is not able to be used, which is less reliable, e.g., there are more data errors so that the data cannot be corrected using regular ECC.

In the following detailed description of the present disclosure, reference is made to the accompanying drawings that form a part hereof, and in which is shown by way of illustration how a number of embodiments of the disclosure may be practiced. These embodiments are described in sufficient detail to enable those of ordinary skill in the art to practice the embodiments of this disclosure, and it is to be understood that other embodiments may be utilized and that process, electrical, and/or structural changes may be made without departing from the scope of the present disclosure.

As used herein, "a number of" something can refer to one or more such things. For example, a number of memory devices can refer to one or more memory devices. Additionally, the designators "N" and "M" as used herein, particularly with respect to reference numerals in the drawings, indicates that a number of the particular feature so designated can be included with a number of embodiments of the present disclosure.

The figures herein follow a numbering convention in which the first digit or digits correspond to the drawing figure number and the remaining digits identify an element or component in the drawing. Similar elements or components between different figures may be identified by the use of similar digits. For example, 100 may reference element "00" in FIG. 1, and a similar element may be referenced as 300 in FIG. 3. As will be appreciated, elements shown in the various embodiments herein can be added, exchanged, and/or eliminated so as to provide a number of additional embodiments of the present disclosure. In addition, as will be appreciated, the proportion and the relative scale of the elements provided in the figures are intended to illustrate the embodiments of the present disclosure, and should not be taken in a limiting sense.

Figure 1:
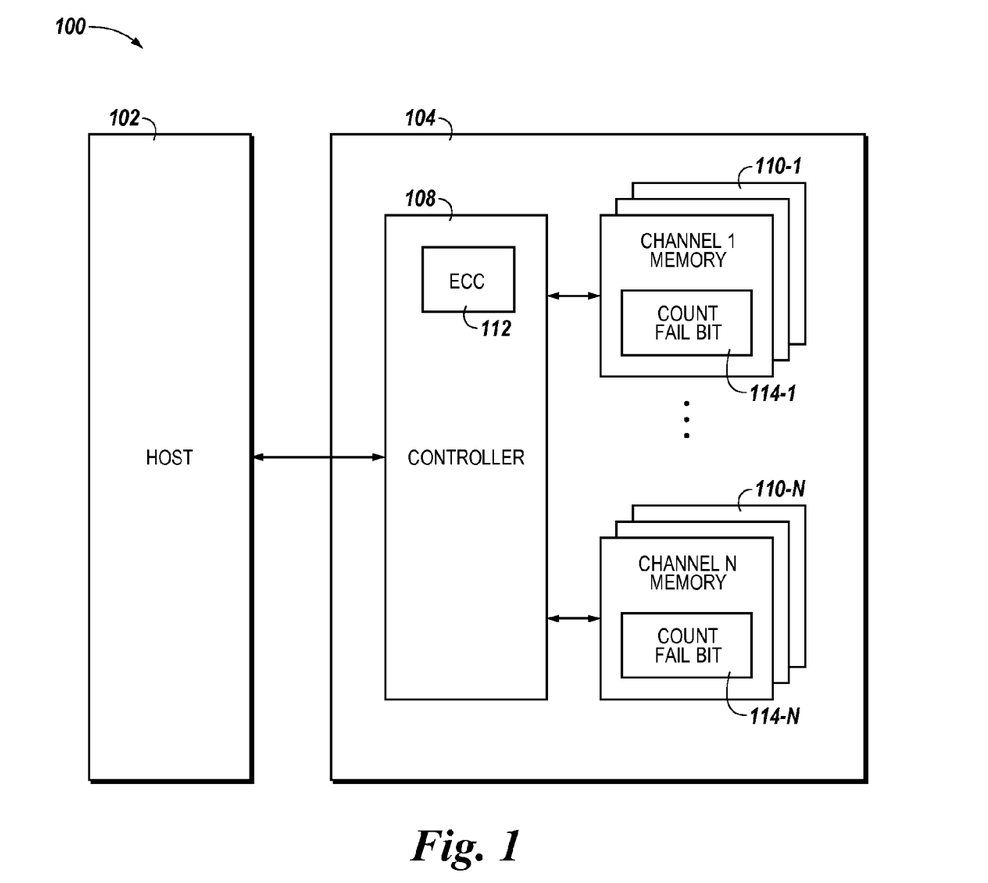
FIG. 1 is a functional block diagram of a computing system including at least one memory system, in accordance with one or more embodiments of the present disclosure.

FIG. 1 is a functional block diagram of a computing system 100 including at least one memory system 104, in accordance with one or more embodiments of the present disclosure. In the embodiment illustrated in FIG. 1, the memory system 104 can include a controller 108 and one or more memory devices 110-1, . . . , 110-N. In this example, the controller 108 is external to the one or more memory devices 110-1, . . . , 110-N. The memory devices 110-1, . . . , 110-N can provide a storage volume for the memory system, e.g., with a file system formatted to the memory devices. The controller 108 can include control circuitry, e.g., hardware, firmware, and/or software. In one or more embodiments, the controller 108 can be an application specific integrated circuit (ASIC) coupled to a printed circuit board including a physical interface and memory devices 110-1, . . . , 110-N.

The controller 108 can include an error correction code (ECC) component 112. The ECC component 112 can include hardware, firmware, and/or software and can perform ECC operations on data, e.g., to correct errors in the data. For example, errors in the state of a memory cell due to threshold voltage shift can be corrected by ECC. ECC operations can include regular ECC operations used to correct errors based only on hard data and advanced ECC operations which can use soft data to correct errors. Whether regular ECC and/or advanced ECC is used can depend on the number of cells that are in error, for instance, e.g., a quantity of erroneous bits.

Memory devices 110-1, . . . , 110-N can include count fail bit circuitry 114-1, . . . , 114-N. Count fail bit circuitry 114-1, . . . , 114-N can be used to determine a quantity of memory cells that change states, e.g., change from state 0 to state 1, between a first sensing operation performed on a number of memory cells using a first sensing voltage and a second sensing operation performed on the number of memory cells using a second sensing voltage. The quantity of memory cells that change states between successive sensing operations as determined by the count fail bit circuitry 114-1, . . . , 114-N can be used to determine whether to output first data, e.g., only hard data or the hard data and a first amount of soft data, or second data, e.g., the hard data, soft data, or the hard data and a second amount of soft data.

As illustrated in FIG. 1, a host 102 can be coupled to the memory system 104. Host 102 can be a laptop computer, personal computes, digital camera, digital recording and playback device, mobile telephone, PDA, memory card reader, interface hub, among other host systems, and can include a memory access device, e.g., a processor. One of ordinary skill in the art will appreciate that "a processor" can intend one or more processors, such as a parallel processing system, a number of coprocessors, etc.

In one or more embodiments, a physical host interface can be in the form of a standardized interface. For example, when the memory system 104 is used for data storage in a computing system 100, a physical host interface can be a serial advanced technology attachment (SATA), peripheral component interconnect express (PCIe), or a universal serial bus (USB), among other connectors and interfaces. In general, however, a physical host interface can provide an interface for passing control, address, data, and other signals between the memory system 104 and a host 102 having compatible receptors for the physical host interface.

The controller 108 can communicate with the memory devices 110-1, . . . , 110-N to read, write, and erase data, among other operations. Controller 108 can have circuitry that may be one or more integrated circuits and/or discrete components. A memory controller could selectively couple an I/O connection (not shown in FIG. 1) of a memory device 110-1, . . . , 110-N to receive the appropriate signal at the appropriate I/O connection at the appropriate time. Similarly, the communication protocol between a host 102 and the memory system 104 may be different than what is required for access of a memory device 110-1, . . . , 110-N. Controller 108 could then translate the commands received from a host into the appropriate commands to achieve the desired access to a memory device 110-1, . . . , 110-N.

A memory device 110-1, . . . , 110-N can include one or more arrays of memory cells, e.g., non-volatile memory cells. The arrays can be flash arrays with a NAND architecture, for example. Embodiments are not limited to a particular type of memory device. For instance, the memory device can include RAM, ROM, DRAM, SDRAM, PCRAM, RRAM, and flash memory, among others.

The memory devices 110-1, . . . , 110-N can include a number of memory cells that can be grouped. As used herein, a group can include one or more memory cells, such as a page, block, plane, die, an entire array, or other groups of memory cells. For example, some memory arrays can include a number of pages of memory cells that make up a block of memory cells. A number of blocks can be included in a plane of memory cells. A number of planes of memory cells can be included on a die. As an example, a 128 GB memory device can include 4314 bytes of data per page, 128 pages per block, 2048 blocks per plane, and 16 planes per device.

In a memory device, a physical page can refer to a unit of writing and/or reading, e.g., a number of cells that are written and/or read together or as a functional group of memory cells. An even page and an odd page can be written and/or read with separate writing and/or reading operations. For embodiments including multilevel cells (MLC), a physical page can be logically divided into, for example, an upper page and a lower page of data. For example, one memory cell can contribute one or more bits to an upper page of data and one or more bits to a lower page of data. Accordingly, an upper page and a lower page of data can be written and/or read as part of one writing and/or reading operation, as the logical upper page and logical lower page are both part of the same physical page.

The embodiment of FIG. 1 can include additional circuitry that is not illustrated so as not to obscure embodiments of the present disclosure. For example, the memory system 104 can include address circuitry to latch address signals provided over I/O connections through I/O circuitry. Address signals can be received and decoded by a row decoder and a column decoder to access the memory devices 110-1, . . . , 110-N. It will be appreciated by those skilled in the art that the number of address input connections can depend on the density and architecture of the memory devices 110-1, . . . , 110-N.

In general, the controller 108 is responsible for converting command packets received from the host 102, e.g., from a PCIe bus, into command instructions for host-memory translation circuitry and for converting memory responses into host system commands for transmission to the requesting host.

In one or more embodiments, data can be written to the memory devices one page at a time. Each page in the memory device can have a number of physical sectors and each physical sector can be associated with an LBA. As an example, a physical page can have 8 physical sectors of data. However, embodiments are not limited to a particular number of physical sectors per physical page.

Figure 2:
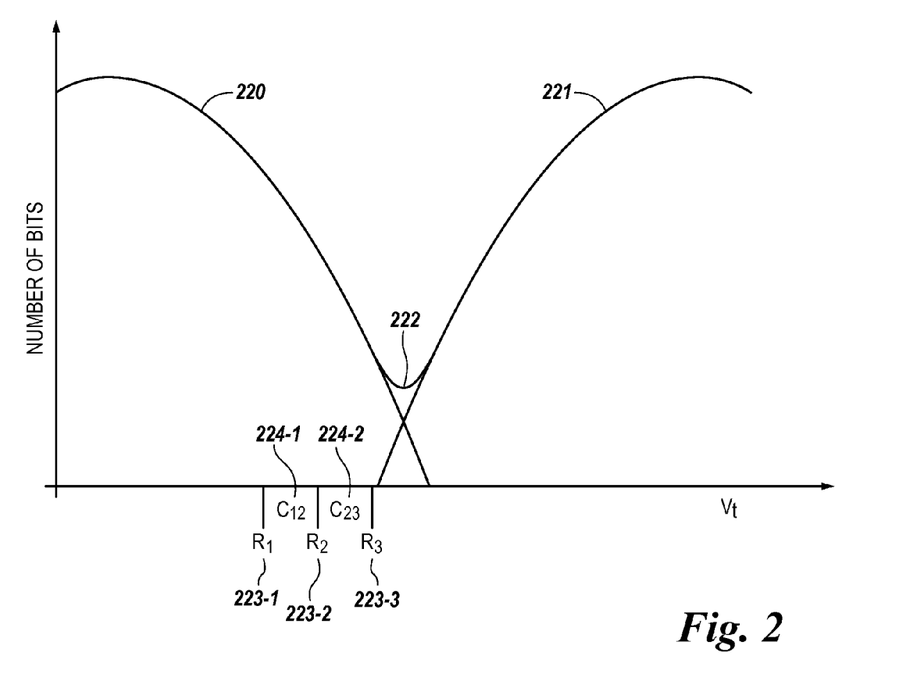
FIG. 2 illustrates a graph representing a number of threshold voltage distributions and sensing voltages in accordance with one or more embodiments of the present disclosure.

FIG. 2 illustrates a graph representing a number of threshold voltage distributions and sensing voltages in accordance with one or more embodiments of the present disclosure. The example shown in FIG. 2 represents one-bit, e.g., two-state, memory cells. However, embodiments of the present disclosure are not limited to this example of one-bit memory cells.

As shown in FIG. 2, threshold voltage (Vt) distributions 220 and 221 represent two states, e.g., L0 and L1, respectively, to which the memory cells can be programmed. State L0 can correspond to data 0 and state L1 can correspond to data 1. However, embodiments are not limited to these data assignments. Curve 222 can represent the sum of Vt distributions 220 and 221.

Vt distributions 220 and 221 can represent a number of memory cells that are programmed to the corresponding states, where the height of a Vt distribution curve indicates a number of cells programmed to a particular voltage within the Vt distribution, on average. The width of the Vt distribution curve indicates the range of voltages that represent a particular state, e.g., the width of the Vt distribution curve 220 for L0 represents the range of voltages that correspond to data 0.

A number of sensing voltages are illustrated in FIG. 2. Such sensing voltages can include program verify voltages and/or read voltages, among other sensing voltages. In the example illustrated in FIG. 2, voltage levels 223-1 (R1), 223-2 (R2), and 223-3 (R3) represent sensing voltages, e.g., read voltages, that can be used to distinguish between states L0 and L1 during a sensing operation. In a sensing operation performed on a selected memory cell in a NAND string, the unselected memory cells of the string can be biased with a pass voltage so as to be in a conducting state.

The sensed state of a memory cell can change, e.g., shift, over time due to a number of mechanisms. For example, a charge storage structure, e.g., floating gate, of the memory cell may lose charge over time. Such charge loss can cause the Vt of the cell to change, e.g., decrease. Additionally, as the memory cell undergoes programming and/or sensing operations over time, program disturb and/or read disturb mechanisms may cause the Vt of the cell to change, e.g., increase. Other mechanisms can also cause the sensed state of a memory cell to change over time, as will be appreciated by one of ordinary skill in the art.

In some instances, a Vt change can alter the sensed state of a memory cell. For example, if a memory cell were programmed to a target state of L1, e.g., data 1, charge loss could cause the Vt of the memory cell to decrease to a level less than R3, or possibly to a level within Vt distribution 220 corresponding to state L0, e.g., data 0.

Accordingly, such a Vt change can result in erroneous data being sensed during a sensing operation performed on the memory cell using the sensing voltages illustrated in FIG. 2, e.g., read voltages R1, R2, and R3. For example, performing a sensing operation using the sensing voltages illustrated in FIG. 2 may result in a determination that the memory cell represents a state other than the target state to which the cell was programmed. For instance, a sensing operation performed on a memory cell that was programmed to a target state of L1 and has undergone charge loss may sense the state of the cell as L0, if read voltage R3 is used in the sensing operation. That is, using read voltage R3 may result in a cell programmed to store data 1 being erroneously sensed as storing data 0.

As such, sensing voltages used during sensing operations performed before the Vt change occurs may no longer provide accurate and/or reliable sensing of memory cells that have undergone a Vt change, e.g., charge loss. Therefore, it can be advantageous to determine hard data and/or soft data associated with the memory cells to account for Vt changes in Vt distributions.

As illustrated in FIG. 2, a number of memory cells can be read using read voltage R1 and read voltage R2. Count fail bit circuitry on a memory device can be used to determine the quantity of memory cells 224-1 ($C_{12}$) that changed states between successive read operations using read voltage R1 and read voltage R2. The quantity of memory cells that change states between successive read operations, e.g., $C_{12}$, can be used to approximate the local minima of a curve representing the first derivative of the number of cells versus threshold voltage. The local minima of the curve representing the first derivative of the number of cells versus threshold voltage can be used to determine the sensing signal, e.g., a higher or lower sensing voltage, that minimizes the number of cells that would change state when read again.

In one or more embodiments, the quantity of memory cells $C_{12}$ can be compared to a threshold quantity of memory cells correctable via regular ECC. If the quantity of memory cells $C_{12}$ is less than or equal to the threshold quantity of memory cells correctable via by regular ECC, data corresponding to the read at R1 or R2 is output to the external controller as hard data associated with the memory cells. Since the quantity of memory cells is below the threshold, the ECC component, e.g., ECC component 112, can correct the erroneous bits within the data.

If the quantity of memory cells $C_{12}$ is greater than the threshold quantity of memory cells correctable via regular ECC, another read is performed using read voltage R3. Count fail bit circuitry on the memory device can be used to determine the quantity of memory cells 224-2 ($C_{23}$) that changed states between read operations using read voltage R2 and read voltage R3. If the quantity of memory cells $C_{23}$ is less than or equal to the threshold quantity of memory cells correctable via by regular ECC, data corresponding to the read at R2 or R3 is output to the external controller as hard data associated with the memory cells.

In one or more embodiments, if the quantity of memory cells that changed states between successive read operations using two read voltages is greater than the threshold quantity of memory cells correctable via by regular ECC, another read is performed using a different read voltage until the quantity of memory cells changing states between two successive read operations using different read voltages is less than or equal to the threshold quantity of memory cells correctable via by regular ECC.

In one or more embodiments, if the quantity of memory cells that changed states between successive read operations using two read voltages is zero, e.g., none of the memory cells changed states, data corresponding to one of the two read voltages is output to controller as hard data associated with the memory cells.

In one or more embodiments, the quantity of memory cells that changed states between successive read operations using two read voltages and/or the data corresponding to the read voltages used to determine the state of the data can be stored on a memory device, such as in a cache of the device. The quantity of memory cells that changed states between successive read operations using two read voltages and the data corresponding to the read voltages used to determine the state of the data can be stored on a memory device until data corresponding to one of the read voltages is output to the external controller as hard data associated with the memory cells.

Figure 3:
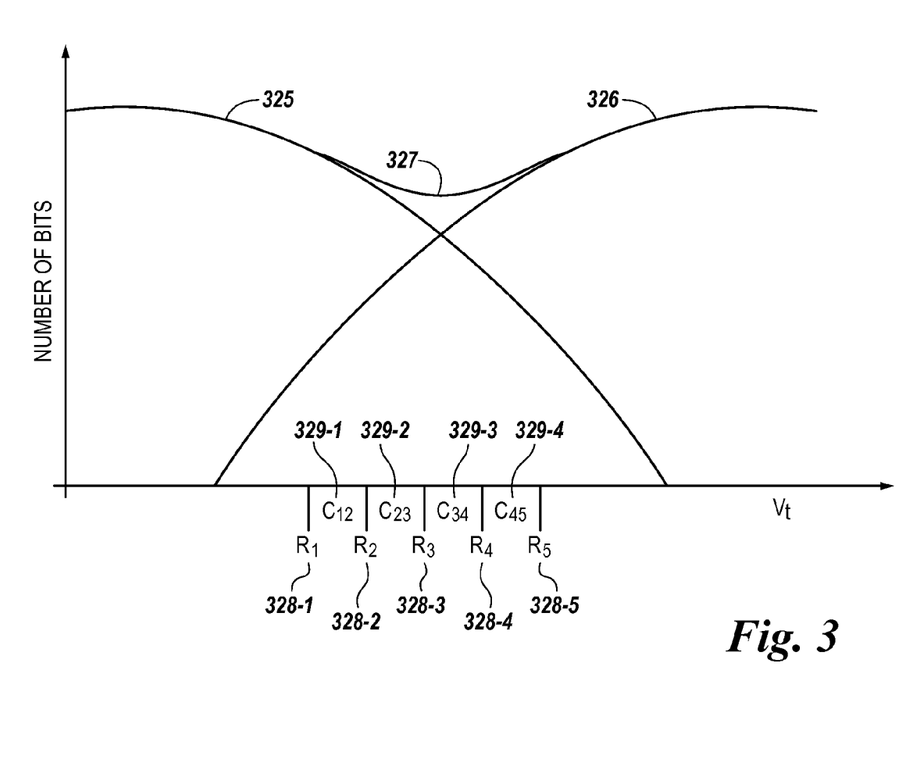
FIG. 3 illustrates a graph representing a number of threshold voltage distributions and sensing voltages in accordance with one or more embodiments of the present disclosure.

FIG. 3 illustrates a graph representing a number of threshold voltage distributions and sensing signals in accordance with one or more embodiments of the present disclosure. The example shown in FIG. 3 represents one-bit, e.g., two-state, memory cells. However, embodiments of the present disclosure are not limited to this example of one-bit memory cells, as will be appreciated by one of ordinary skill in the art.

As shown in FIG. 3, threshold voltage (Vt) distributions 325 and 326 represent two states, e.g., L0 and L1, respectively, to which the memory cells can be programmed. State L0 can correspond to data 0 and state L1 can correspond to data 1. However, embodiments are not limited to these data assignments. Curve 327 can represent the sum of Vt distributions 325 and 326.

A number of sensing voltages are illustrated in FIG. 3. Such sensing voltages can include program verify voltages and/or read voltages, among other sensing voltages. In the example illustrated in FIG. 3, voltage level 328-1 (R1), 328-2 (R2), 328-3 (R3), 328-4 (R4), and 328-5 (R5) represent sensing voltages, e.g., read voltages, that can be used to distinguish between states L0 and L1 during a sensing operation. Read voltages R1, R2, R3, R4, and R5 can be separated by equal increments of less than 200 mV, e.g., R1 is 1.0 V, R2 is 1.1 V, R3 is 1.2 V, R4 is 1.3 V, and R5 is 1.4V. However, embodiments are not limited to using sensing voltages that are separated by equal increments and/or to increments of less than 200 mV.

As illustrated in FIG. 3 and described below, read voltages and count fail bit circuitry can be used to determine hard data and/or soft data associated with the memory cells to account for Vt changes in Vt distributions, for example. The hard data and/or soft data associated with the memory cells can be stored in a memory device for each read, e.g., in a cache of the memory device, and then sent to an external controller when it is determined whether to output, for example, only the hard data (where a regular ECC operation can be used to correct errors), or whether to output, for example, the hard data and soft data (where a more advanced ECC operation can be used to correct errors). A number of memory cells can be read using read voltage R1 and read voltage R2. Count fail bit circuitry on a memory device can be used to determine the quantity of memory cells 329-1 ($C_{12}$) that changed states between successive read operations using read voltage R1 and read voltage R2.

In one or more embodiments, the quantity of memory cells $C_{12}$ that changed states between successive read operations at voltage R1 and at read voltage R2 can be compared to a threshold quantity of memory cells correctable via regular ECC. If the quantity of memory cells $C_{12}$ is less than or equal to the threshold quantity of memory cells correctable via regular ECC, data corresponding to the read at R1 or R2 is output to the external controller as hard data associated with the memory cells.

If the quantity of memory cells $C_{12}$ is greater than the threshold quantity of memory cells correctable via regular ECC, another read is performed using read voltage R3. Count fail bit circuitry on memory device can be used to determine the quantity of memory cells 329-2 ($C_{23}$) that changed states between successive read operations at read voltage R2 and at read voltage R3. If the quantity of memory cells $C_{23}$ is less than or equal to the threshold quantity of memory cells correctable via regular ECC, data corresponding to the read at R2 or R3 is output to the external controller as hard data associated with the memory cells.

If the quantity of memory cells $C_{23}$ is greater than the threshold quantity of memory cells correctable via regular ECC, another read is performed using read voltage R4. Count fail bit circuitry on the memory device can be used to determine the quantity of memory cells 329-3 ($C_{34}$) that changed states between successive read operations at read voltage R3 and at read voltage R4. If the quantity of memory cells $C_{34}$ is less than or equal to the threshold quantity of memory cells correctable via regular ECC, data corresponding to the read at R3 or R4 is output to the external controller as hard data associated with the memory cells.

If the quantity of memory cells $C_{34}$ is greater than the threshold quantity of memory cells correctable via regular ECC, another read is performed using read voltage R5. Count fail bit circuitry on memory device can be used to determine the quantity of memory cells 329-4 ($C_{45}$) that changed states between successive read operations at read voltage R4 and at read voltage R5. If the quantity of memory cells $C_{45}$ is less than or equal to the threshold quantity of memory cells correctable via regular ECC, data corresponding to the read at R4 or R5 is output to the external controller as hard data associated with the memory cells.

If the quantity of memory cells $C_{45}$ is still greater than the threshold quantity of memory cells correctable via regular ECC, data corresponding to one of the read operations associated with the lowest quantity of memory cells that changed states can be output to the external controller as hard data associated with the memory cells. For example, data corresponding to R3 could be output to the external controller as hard data associated with the memory cells. Data corresponding to one or more of the remaining reads can be output to the external controller as soft data associated with the memory cells. For example, data corresponding to the reads at R1, R2, R4, and/or R5 could be output to the external controller as soft data associated with the memory cells. The soft data can be used by the external controller to perform an advanced ECC operation.

In one or more embodiments, a number of read operations, e.g., 5 read operations, can be performed and a number of quantities of memory cells that change states between successive read operations can be determined. The quantities of memory cells that change states between successive read operations can be compared to a threshold quantity correctable via regular ECC and/or to a previous determined quantity of memory cells that changed states between read operations. The determination of outputting hard data and/or soft data associated with the memory cells based on the read voltages, for example, only hard data or the hard data and soft data, can be made via this comparison, as described above.

As such, in one or more embodiments of the present disclosure, soft data can be selectively provided from a memory device to a controller external to the memory device, such as only when advanced ECC is used or might be needed to correct data read from a number of memory cells. For instance, if successive reads, in accordance with embodiments described herein, result in a determined quantity of bits correctable via regular ECC, e.g., without soft data, the soft data associated with the number of memory cells is not necessarily provided to the external controller.

The present disclosure includes methods and devices for data sensing. One such method includes performing a number of successive sense operations on a number of memory cells using a number of different sensing voltages, determining a quantity of the number memory cells that change states between consecutive sense operations of the number of successive sense operations, and determining, based at least partially on the determined quantity of the number of memory cells that change states between consecutive sense operations, whether to output hard data corresponding to one of the number of successive sense operations.

Although specific embodiments have been illustrated and described herein, those of ordinary skill in the art will appreciate that an arrangement calculated to achieve the same results can be substituted for the specific embodiments shown. This disclosure is intended to cover adaptations or variations of a number of embodiments of the present disclosure. It is to be understood that the above description has been made in an illustrative fashion, and not a restrictive one. Combination of the above embodiments, and other embodiments not specifically described herein will be apparent to those of ordinary skill in the art upon reviewing the above description. The scope of a number of embodiments of the present disclosure includes other applications in which the above structures and methods are used. Therefore, the scope of a number of embodiments of the present disclosure should be determined with reference to the appended claims, along with the full range of equivalents to which such claims are entitled.

In the foregoing Detailed Description, some features are grouped together in a single embodiment for the purpose of streamlining the disclosure. This method of disclosure is not to be interpreted as reflecting an intention that the disclosed embodiments of the present disclosure have to use more features than are expressly recited in each claim. Rather, as the following claims reflect, inventive subject matter lies in less than all features of a single disclosed embodiment. Thus, the following claims are hereby incorporated into the Detailed Description, with each claim standing on its own as a separate embodiment.

What is claimed is:

1. A method for sensing data, comprising:
    performing a number of sense operations on a number of memory cells using a number of different sensing signals;
    determining a quantity of the number of memory cells that change sensed states between the sense operations, wherein determining the quantity comprises determining a quantity that change states between one of the number of sense operations and another of the number of sense operations;
    determining, based at least partially on the determined quantity of the number of memory cells that change sensed states between the sense operations, whether to output first data associated with the number of memory cells or to output second data associated with the number of memory cells; and
    outputting the first data in response to a determination that the determined quantity is less than a threshold, wherein the first data corresponds to either data sensed during the one of the sense operations or data sensed during another of the sense operations.

2. The method of claim 1, including outputting the second data if the determined quantity of the number of memory cells is greater than the threshold.

3. The method of claim 1, wherein performing the number of sense operations on the number of memory cells includes sensing the memory cells with a number of different sensing voltages in increments of less than 200 mV.

4. The method of claim 1, wherein performing the number of sense operations on the number of memory cells includes sensing with sensing voltages having equal increments between the number of different sensing voltages.

5. The method of claim 1, wherein outputting the first data comprises outputting hard data to an external controller.

6. The method of claim 2, wherein outputting the second data includes outputting soft data to an external controller that uses the soft data to perform an advanced ECC operation.

7. The method of claim 2, further comprising using advanced ECC for correcting the first data with the second data.

8. The method of claim 2, wherein the method further includes storing the second data in a memory device that includes the memory cells before outputting the second data.

9. The method of claim 1, further comprising using regular ECC for correcting the first data.

10. A method for sensing data, comprising:
    determining a first quantity of memory cells that change from a first state to a second state between sensing a number of memory cells at a first sensing voltage and sensing the number of memory cells at a second sensing voltage;
    determining a second quantity of memory cells that change from the first state to the second state between sensing the number of memory cells at the second sensing voltage and sensing the number of memory cells at a third sensing voltage;
    determining a third quantity of memory cells that change from the first state to the second state between sensing the number of memory cells at the third sensing voltage and sensing the number of memory cells at a fourth sensing voltage; and
    outputting hard data corresponding to either the first sensing voltage or the second sensing voltage and soft data corresponding to the first sensing voltage, the second sensing voltage, or the third sensing voltage, when the second quantity and third quantity of memory cells are greater than the first quantity of memory cells.

11. The method of claim 10, wherein the method further includes
determining a fourth quantity of memory cells that change from the first state to the second state between sensing the number of memory cells at the fourth sensing voltage and sensing the number of memory cells at a fifth sensing voltage, wherein outputting hard data corresponding to either the first sensing voltage or the second sensing voltage further includes outputting the hard data corresponding to either the first sensing voltage or the second sensing voltage when the fourth quantity is greater than the first quantity.

12. The method of claim 11, wherein outputting the soft data also includes outputting soft data corresponding to the fourth or the fifth sensing voltages.

13. The method of claim 10, wherein outputting hard data and soft data includes outputting hard data and soft data to an external controller.

14. The method of claim 10, further including using an advanced ECC operation to correct the hard data using soft data.

15. A method for sensing data, comprising:
performing a first sensing operation using a first sensing voltage to determine a state of each of a number of memory cells;
performing a second sensing operation using a second sensing voltage to determine the state of each of the number of memory cells;
determining a first quantity of the number of memory cells whose determined state changes between the first and the second sensing operation;
responsive to determining the first quantity of the number of cells exceeds a threshold quantity:
  performing a third sensing operation on the number of memory cells; and
  determining a second quantity of the number of memory cells whose determined state changes between the second and the third sensing operation;
responsive to determining the first quantity of the number of cells does not exceed the threshold quantity, outputting only hard data corresponding to one of the first sensing operation or the second sensing operation; and
responsive to determining the second quantity of the number of cells does not exceed a threshold quantity, outputting only hard data corresponding to one of the second sensing operation or the third sensing operation.

16. The method of claim 15, including:
responsive to determining the second quantity of the number of cells exceeds the threshold quantity:
  performing a fourth sensing operation on the number of memory cells; and
  determining a third quantity of the number of memory cells whose determined state changes between the third and the fourth sensing operation.

17. The method of claim 16, responsive to determining the third quantity of the number of cells exceeds the threshold quantity:
performing a fifth sensing operation on the number of memory cells; and
determining a fourth quantity of the number of memory cells whose determined state changes between the fourth and the fifth sensing operation; and
responsive to determining the third quantity of the number of cells does not exceed the threshold quantity, outputting only hard data corresponding to one of the third sensing operation or the fourth sensing operation.

18. The method of claim 17, responsive to determining the fourth quantity of the number of cells exceeds the threshold quantity:
outputting hard data corresponding to a sensing operation that corresponds to the least of the first, second, third and fourth quantity.

19. The method of claim 17, responsive to determining the fourth quantity of the number of cells exceeds the threshold quantity:
outputting soft data corresponding to a sensing operation other than the sensing operation corresponding to the hard data.

20. The method of claim 15, wherein the threshold quantity corresponds to a quantity of the memory cells correctable by a first type of ECC operation, and wherein a second type of ECC operation is needed to correct a quantity of cells that exceeds the threshold quantity.

21. A device, comprising:
an array of memory cells; and
circuitry coupled to the array and configured to:
  determine a quantity of a number of the memory cells of the array that change states between sense operations of a number of successive sense operations performed on the number of memory cells, wherein determining the quantity comprises determining a quantity that change states between one of the number of successive sense operations and another of the number of successive sense operations; and
  output first data associated with the number of memory cells or second data associated with the number of memory cells at least partially in response to a determination that the determined quantity is less than a threshold, wherein the first data corresponds to either data sensed during the one of the number of successive sense operations or data sensed during another of the number of successive sense operations.

22. The device of claim 21, wherein the first data is hard data and the second data is soft data, and wherein the circuitry is configured to output the soft data corresponding to the number of successive sense operations other than the sensing voltage from the sense operation corresponding to the hard data.

23. The device of claim 22, wherein the soft data corresponds to the number of successive sense operations that include sensing voltages in equal increments surrounding the sensing voltage from the sense operation corresponding to the hard data.

24. The device of claim 22, wherein the hard data and the soft data are output to an external controller associated with the memory device.

25. The device of claim 21, wherein the hard data is output when data is correctable by regular ECC.

26. The device of claim 22, wherein the soft data is output when data is correctable by advanced ECC.

27. A device, comprising:
an array of memory cells; and
circuitry coupled to the array and configured to:
  determine a first quantity of memory cells changing from a first state to a second state when sensing a number of memory cells at a first sensing voltage and a second sensing voltage;
  determine a second quantity of memory cells changing from the first state to the second state when sensing the number of memory cells at the second sensing voltage and a third sensing voltage;

determine a third quantity of memory cells changing from the first state to the second state when sensing the number of memory cells at the third sensing voltage and a fourth sensing voltage; and determine a fourth quantity of memory cells changing from the first state to the second state when sensing the number of memory cells at the fourth sensing voltage and a fifth sensing voltage;

wherein the circuitry is configured to output hard data corresponding to the first, second, third, fourth, or fifth sensing voltages when the first, second, third, or fourth quantity is greater than a previous quantity.

28. The device of claim 27, wherein the circuitry is configured to output soft data corresponding to the first, second, third, fourth, or fifth sensing voltages.

29. The device of claim 28, wherein the soft data is stored in the memory cells before being output to an external controller.

30. The device of claim 29, wherein the soft data is used by the external controller in an advanced ECC operation.

31. The device of claim 27, wherein the circuitry includes count fail bit circuitry.

32. A device, comprising:
an array of memory cells; and
circuitry coupled to the array and configured to:
determine a first quantity of a number of the memory cells of the array whose determined state changes between a first sensing operation and a second sensing operation;
determine, responsive to determining the first quantity of the number of memory cells exceeds the threshold quantity of the memory cells, a second quantity of the number of memory cells whose determined state changes between the second sensing operation and a third sensing operation;
output, responsive to determining the first quantity of the number of memory cells a does not exceed the threshold quantity of the memory cells, only hard data associated with the first quantity of the number of memory cells; and
output responsive to determining the second quantity of the number of memory cells exceeds a threshold quantity of the memory cells, soft data corresponding to sensing voltages used for at least one of the first and second sensing operations.

33. The device of claim 32, wherein the circuitry is configured to perform the first sensing operation using a first sensing voltage to determine the state of each of the number of memory cells and perform the second sensing operation using a second sensing voltage to determine the state of each of the number of memory cells.

34. The device of claim 33, wherein the circuitry is configured to determine, responsive to determining the second quantity of the number of cells exceeds the threshold quantity of the memory cells, a third quantity of the number of memory cells whose determined state changes between the third sensing operation and a fourth sensing operation and determine, responsive to determining the third quantity of the number of cells exceeds the threshold quantity, a fourth quantity of the number of memory cells whose determined state changes between the fourth sensing operation and a fifth sensing operation.

35. The device of claim 34, wherein the circuitry is configured to output, responsive to determining the fourth quantity of the number of cells exceeds the threshold quantity, soft data corresponding to sensing voltages used for at least one of the first, second, third, fourth, and fifth sensing operations.

36. The device of claim 35, wherein the soft data is stored in the memory device before being output to an external controller and where the soft data is used by the external controller in an advanced ECC operation.

* * * * *

UNITED STATES PATENT AND TRADEMARK OFFICE
CERTIFICATE OF CORRECTION

PATENT NO.       : 8,631,288 B2  
APPLICATION NO.  : 13/047555  
DATED            : January 14, 2014  
INVENTOR(S)      : Mark A. Helm et al.

Page 1 of 1

It is certified that error appears in the above-identified patent and that said Letters Patent is hereby corrected as shown below:

In the Claims

In column 13, line 37, in Claim 32, after "cells" delete "a".

Signed and Sealed this
First Day of April, 2014

Michelle K. Lee
*Deputy Director of the United States Patent and Trademark Office*